(12) United States Patent
Tanaka

(10) Patent No.: US 8,767,470 B2
(45) Date of Patent: Jul. 1, 2014

(54) MEMORY SEGMENT ACCESSING IN A MEMORY DEVICE

(75) Inventor: Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/564,883

(22) Filed: Aug. 2, 2012

(65) Prior Publication Data

US 2012/0294088 A1 Nov. 22, 2012

Related U.S. Application Data

(62) Division of application No. 12/365,533, filed on Feb. 4, 2009, now Pat. No. 8,254,174.

(51) Int. Cl.
*G11C 16/04* (2006.01)
*G11C 16/06* (2006.01)

(52) U.S. Cl.
USPC ............ 365/185.18; 365/185.13; 365/185.21; 365/189.15; 365/230.01

(58) Field of Classification Search
USPC ............. 365/185.05, 185.11, 185.12, 185.17, 365/185.18, 185.13, 185.21, 189.15, 230.01
See application file for complete search history.

(56) References Cited

U.S. PATENT DOCUMENTS

| 5,995,417 | A | 11/1999 | Chen et al. |
| 7,394,695 | B2 | 7/2008 | Takeuchi et al. |
| 7,426,141 | B2 | 9/2008 | Takeuchi |
| 7,542,343 | B1 | 6/2009 | Kim |
| 2004/0213045 | A1 | 10/2004 | Nakai |
| 2006/0203547 | A1* | 9/2006 | Takeuchi ................. 365/185.09 |
| 2009/0119446 | A1* | 5/2009 | Tamada ........................ 711/103 |

* cited by examiner

*Primary Examiner* — Thao H Bui
(74) *Attorney, Agent, or Firm* — Dicke, Billig & Czaja, PLLC

(57) ABSTRACT

Bit lines of a memory segment are read at substantially the same time by coupling a selected memory segment and, at some of the data lines of any intervening segments, to respective data caches. The bit lines of the unselected memory segments that are not used to couple the selected segment to the data caches can be coupled to their respective source lines.

20 Claims, 8 Drawing Sheets

MEMORY SEGMENT ACCESSING IN A MEMORY DEVICE

RELATED APPLICATION

This is a divisional of U.S. application Ser. No. 12/365,533, titled "MEMORY SEGMENT ACCESSING IN A MEMORY DEVICE," filed Feb. 4, 2009 and issued as U.S. Pat. No. 8,254,174 on Aug. 28, 2012, which is commonly assigned and incorporated herein by reference.

TECHNICAL FIELD

The present invention relates generally to memory devices and in a particular embodiment the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array that includes a large number of memory cells. Each of the memory cells includes a floating gate field-effect transistor capable of holding a charge. The cells are usually grouped into blocks of 64 pages of single level cells (SLC) or 128 pages of multilevel cells (MLC), where each page is typically 2048 bytes of data on 32 word lines. Each of the cells within a block can be electrically programmed on a random basis by charging the floating gate.

The data in a cell is determined by the presence or absence of charge on the floating gate. Each memory cell can be programmed as an SLC or MLC. Each cell's threshold voltage ($V_t$) determines the data that is stored in the cell. For example, in an SLC, a $V_t$ of 0.5V can indicate a programmed cell while a $V_t$ of −0.5V might indicate an erased cell. The multilevel cell has multiple $V_t$ ranges that each indicates a different state. Multilevel cells can take advantage of the analog nature of a traditional flash cell by assigning a bit pattern to a specific voltage range for the cell. This technology permits the storage of two or more bits per cell, depending on the quantity of voltage ranges assigned to the cell. The charge can be removed from the floating gate by a block erase operation.

As the performance of systems incorporating flash memory increases, it is desirable for the programming and reading performance of the flash memory to increase as well. Increased memory performance would reduce the resulting data bottleneck that can occur when a faster system programs or reads a slower flash memory device.

For the reasons stated above, and for other reasons stated below which will become apparent to those skilled in the art upon reading and understanding the present specification, there is a need in the art for a way to increase performance of a memory device.

DETAILED DESCRIPTION

Figure 1:
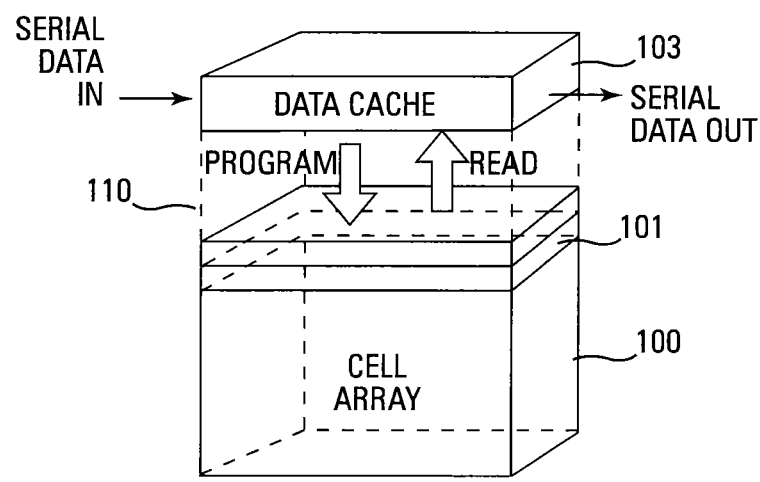
FIG. 1 shows a block diagram of one embodiment of memory array and data cache with connecting circuitry.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of a memory cell array 100, data cache 103, and switching circuitry 110. The memory cell array 100 can be organized into memory blocks 101 that are comprised of 64 pages of single level cell data or 128 pages of multilevel cell data, for example. Each page can be comprised of 2048 bytes of data on 32 access lines (e.g., word lines). Each memory cell block 101 can be organized from a plurality of series strings of memory cells. A portion of a memory block is illustrated in FIG. 2 and discussed subsequently.

The data cache 103 is a temporary data storage device for both data to be programmed to the memory array 100 and data read from the memory array 100. In the illustrated embodiment, data to be programmed into the memory array 100 is serially input to the data cache 103. This data is then transmitted to the memory array 100 through the switching circuitry 110. Data that is read from the memory array 100 is read through the switching circuitry 110 to the data cache 103.

Figure 2:
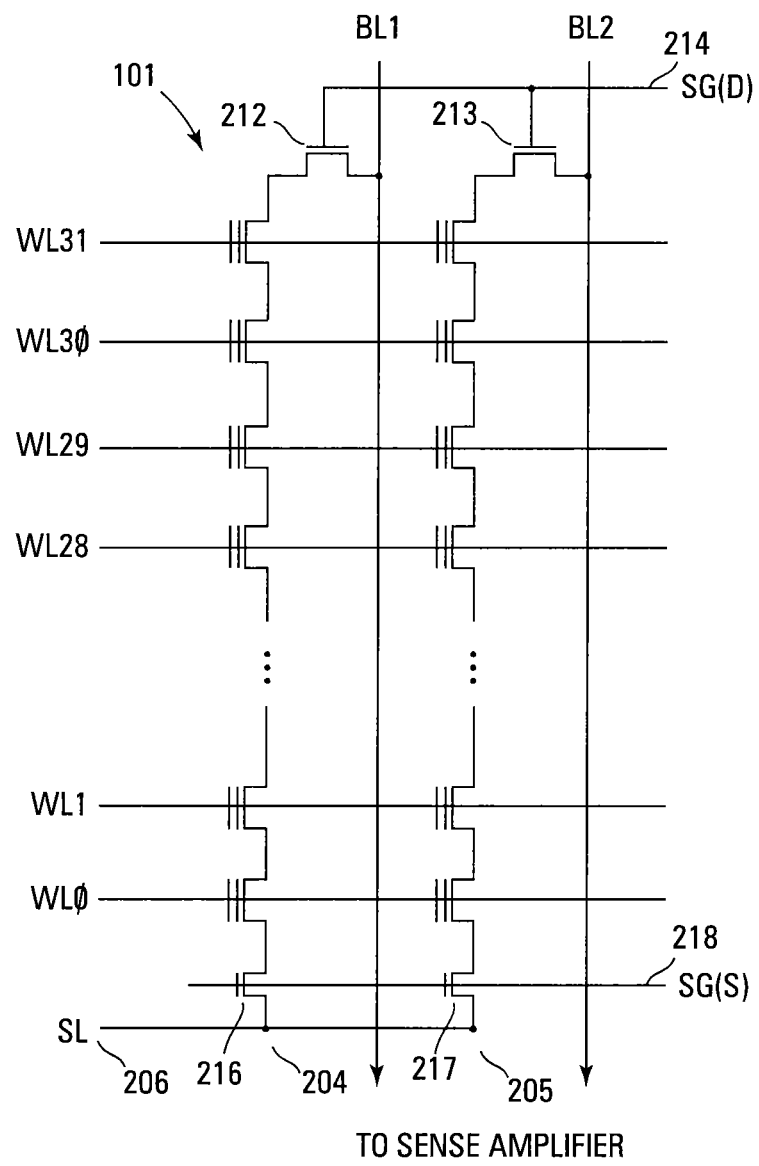
FIG. 2 shows a schematic diagram of one embodiment of memory cell series strings in accordance with the block diagram of FIG. 1.

FIG. 2 illustrates a schematic diagram of a portion of a NAND architecture memory block 101 comprising series strings 204, 205 of non-volatile memory cells. While the subsequent discussions refer to a NAND memory device, the present embodiments are not limited to such an architecture but can be used in other memory device architectures as well. For example, alternate embodiment memory blocks might be organized in NOR or AND architectures.

The memory block portion 101 is comprised of an array of non-volatile memory cells (e.g., floating gate) arranged in columns such as series strings 204, 205. Each of the cells 101 is coupled drain to source in each series string 204, 205. An access line WL0-WL31 that spans across multiple series strings 204, 205 is connected to the control gates of each memory cell in a row in order to bias the control gates of the memory cells in the row. The data lines (e.g., bit lines) BL1, BL2 can be connected to sense circuitry (not shown) that detects the state of each cell by sensing current on a particular bit line.

Each series string 204, 205 of memory cells is coupled to a source line 206 by a source select gate transistor 216, 217 and to an individual bit line BL1, BL2 by a drain select gate transistor 212, 213. The source select gate transistors 216, 217 are controlled by a source select gate control line SG(S) 218 coupled to their control gates. The drain select gate transistors 212, 213 are controlled by a drain select gate control line SG(D) 214.

Figure 3:
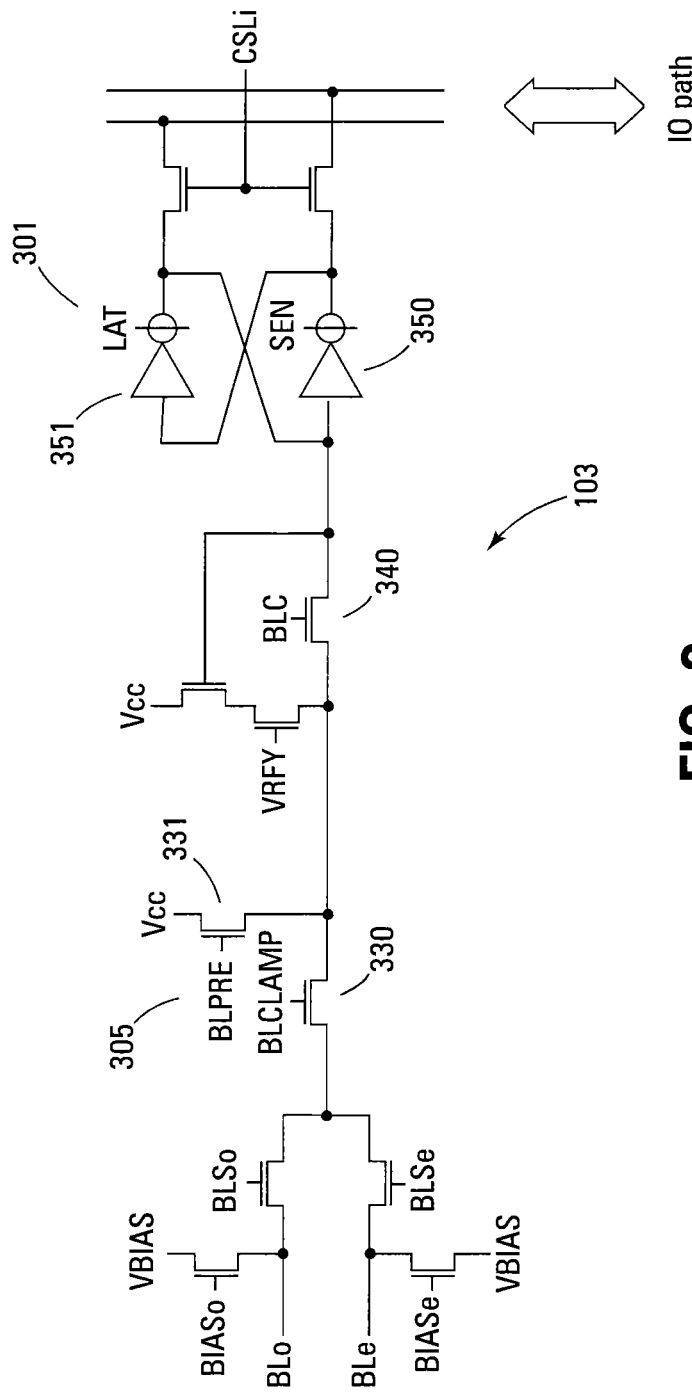
FIG. 3 shows a schematic diagram of one embodiment of a data cache in accordance with the block diagram of FIG. 1.

FIG. 3 illustrates a schematic diagram of one embodiment of a data cache 103 that is used in the embodiment of FIG. 1. This diagram is for purposes of illustration only as the present embodiments are not limited to any one data cache circuit.

The data cache 103 is comprised of a bit line voltage controller circuit 305 and a data latch circuit 301. The data latch circuit inputs and outputs its stored data on the I/O path that, in one embodiment, is a serial I/O bus to and from the data cache.

The bit line voltage controller circuit 305 controls bit line precharge levels and bit line sense levels during a read operation. The bit line precharge is carried out by applying a voltage, high enough to transfer a supply voltage (e.g., Vcc), to a bit line precharge signal line BLPRE connected to a transistor 331 and by applying a bit line clamp voltage to a bit line clamp signal line BLCLAMP connected to a transistor 330. By adjusting a potential level of the bit line clamp voltage, a variety of bit line precharge levels can be generated. This is because the bit line is charged up to BLCLAMP-Vt (Vt: threshold voltage of transistor 330). After the bit line is precharged, if a read current flows through an associated NAND string, a potential level of the bit line goes down from the precharge level. Otherwise, the precharge level remains unchanged, which should provide no noise on the bit line. When the potential level of the bit line is sensed, the transistor 331 is turned off and a bit line sense voltage is applied to BLCLAMP. By adjusting a potential level of the bit line sense voltage, a variety of bit line sense levels can be realized. This is because the potential level of the bit line is transferred from the bit line to the data cache only in the case that the potential level of the bit line is less than BLCLAMP-Vt. The potential level of the bit line is sensed by an inverter 350. During the sensing, a transistor 340 is turned on by applying a high enough voltage to BLC line and an inverter 351 is disabled. After the sensing, the inverter 351 is enabled and then the sensing result is latched in the data latch circuit 301.

When data stored in the data latch circuit is programmed into a selected memory cell, a high enough voltage is applied to BLCLAMP and BLC in order to transfer the data stored in the data latch circuit to the bit line.

Figure 4:
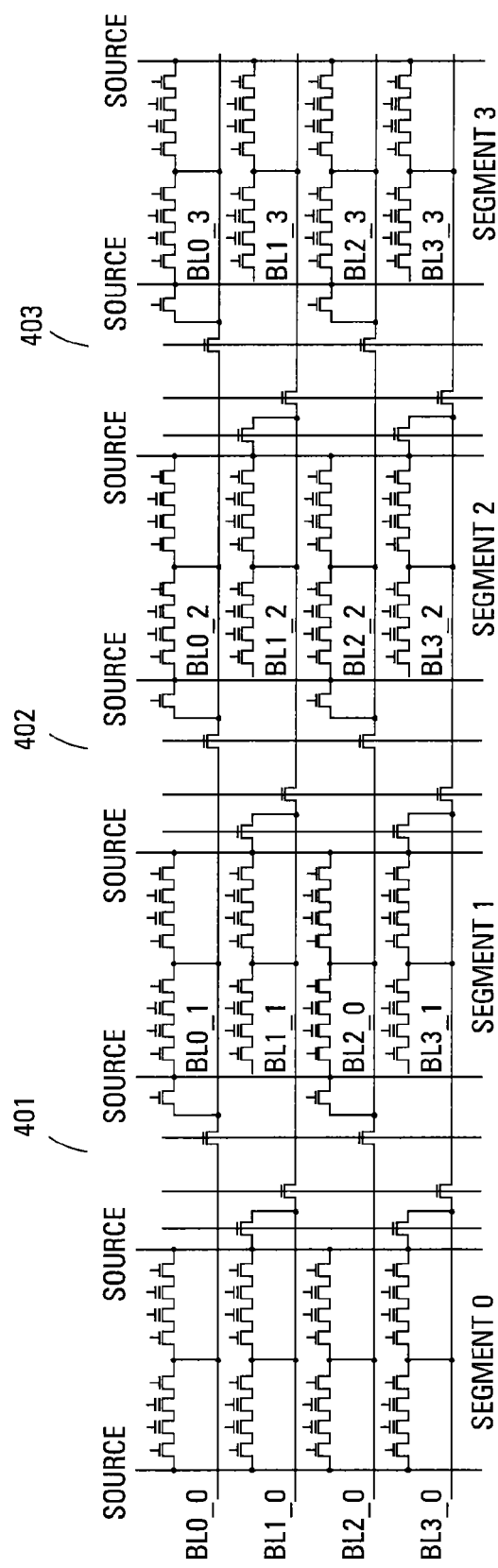
FIG. 4 shows a schematic diagram of one embodiment of the memory array in accordance with the block diagram of FIG. 1.
Figure 5:
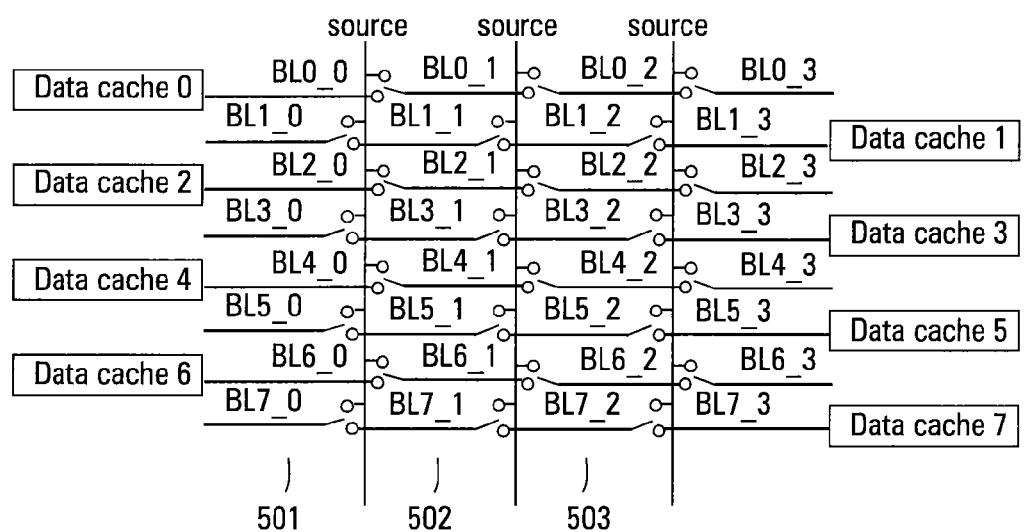
FIG. 5 shows a schematic diagram of one embodiment of the switching circuitry in accordance with the block diagram of FIG. 1.

FIG. 4 illustrates a schematic diagram of one embodiment of the memory array in combination with the switching circuitry of FIG. 5. This embodiment is organized in segments of memory. Segment 0, segment 1, segment 2, and segment 3 are shown. Alternate embodiments might have different segments.

Each memory segment is shown being comprised of a plurality of bit lines. For purposes of clarity, only four bit lines (BL0-BL3) are shown for each segment. Alternate embodiments can use different quantities of bit lines.

Each bit line in each segment is subsequently referred to with both the bit line label and the segment label. Fore example, bit line 0 in segment 2 is referred to as BL0_2. Also for purposes of clarity, each series string of memory cells is shown greatly shortened in order to illustrate the concept that each segment is comprised of multiple bit lines. In the illustrated embodiment, two series strings of memory cells are coupled together by their drain ends and their source ends are each coupled to a source line. While FIG. 4 shows only eight series strings per segment, an actual memory device can have substantially more (e.g., 512).

The source lines of each segment are not required to be grounded. During a read operation, current flows from the bit line to the source. Therefore, the source may be referred to as a "local ground" in that it might still have 0.1V on it but, as long as the current flows, the reference is to the source line. In alternate embodiment, the source line may be coupled to the memory array ground.

Between each memory segment is the switching circuitry shown here as comprising switches 401-403 that couples a respective memory segment to a data cache. The transistors shown in the switching circuitry act as switching devices to control the connection. These switches and their operation are shown in greater detail in FIGS. 5, 6, and 8 and discussed subsequently.

According to one or more embodiments, the switching circuitry enables a read operation to read out even and odd bit lines at the same time while reducing bit line-to-bit line capacitive coupling and/or noise issues. FIG. 5 shows that half of the data caches are associated with even bit lines and the other half are associated with odd bit lines. FIG. 5 further shows the switches 501-503 between segments that provide the connectivity from the bit lines to the data caches. BL0_1, BL2_1, BL4_1 and BL6_1 are the even bit lines for segment 1 and use the first set of switches 501 for connecting to the data caches or to a source line. BL1_0, BL3_0, BL5_0 and BL7_0 are the odd bit lines for segment 0 and use the first set of switches 501 for connecting to the data caches or to a source line. BL0_2, BL2_2, BL4_2 and BL6_2 are the even bit lines for segment 2 and use the second set of switches 502 for connecting to the data caches or to a source line. BL1_1, BL3_1, BL5_1 and BL7_1 are the odd bit lines for segment 1 and use the second set of switches 502 for connecting to the data caches or to a source line. BL0_3, BL2_3, BL4_3 and BL6_3 are the even bit lines for segment 3 and use the third set of switches 503 for connecting to the data caches or to a source line. BL1_2, BL3_2, BL5_2 and BL7_2 are the odd bit lines for segment 2 and use the third set of switches 503 for connecting to the data caches or to a source line.

When one segment is accessed (e.g., read or program), the bit lines of the remaining segments that are located farther from their associated data caches than the selected segment are disconnected from the their associated data caches (and can be used for shielding, such as where these bit lines are coupled through their respective switches to a source line). Only the bit lines from the selected segment and the segments between the selected segment and their associated data caches are coupled together, and the remaining bit lines can be coupled with a source line. As a result, BL-to-BL coupling can be reduced to one fourth of the prior art coupling. Thus, only the selected segments that are necessary to an associated data cache for reading are used. The remaining segments can be used for shielding since the unused segments can be coupled through their respective switches to a source line.

Figure 6:
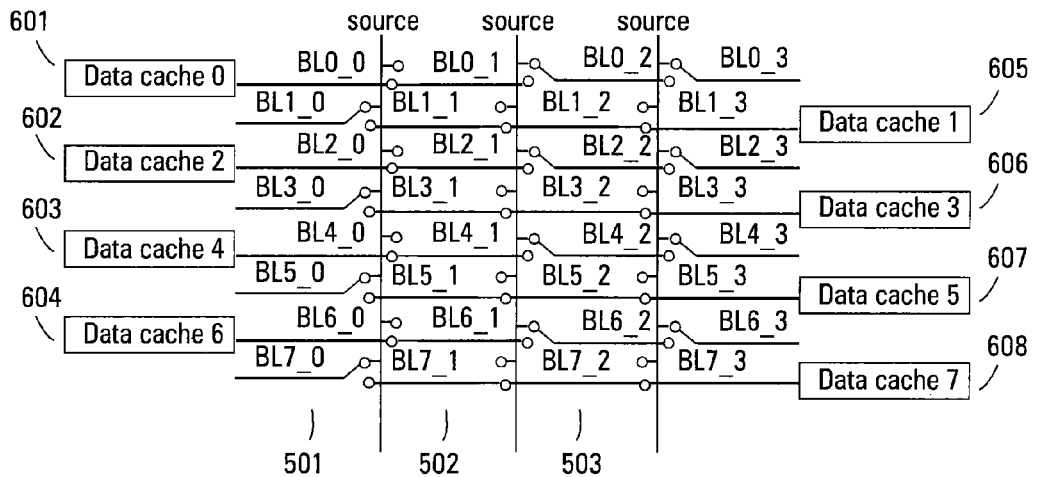
FIG. 6 shows one embodiment of the operation of the switching circuitry in accordance with the embodiment of FIG. 5.

FIG. 6 illustrates one example of an access to the memory cells of the bit lines in segment 1. The even bit lines of BL0_0 and BL0_1 are connected to an associated data cache 601 through the first set of switches 501. In the same way, BL2_0 and BL2_1, BL4_0 and BL4_1, and BL6_0 and BL6_1 are each connected to respective even data caches 602-604. The odd bit lines of BL1_1-BL1_3 are connected to an associated data cache 605 through the second and third sets of switches 502 and 503. In the same way, BL3_1-BL3_3, BL5_1-BL5_3, and BL7_1-BL7_3 are each connected to respective odd data caches 606-608. The remaining bit lines are all connected to a source line through respective switches.

Figure 7:
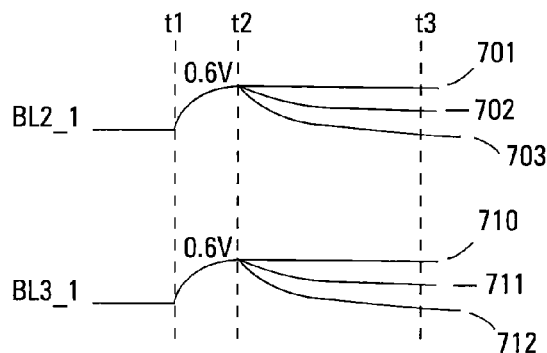
FIG. 7 shows a timing diagram of bit line signals in accordance with the embodiment of FIG. 6.

FIG. 7 shows a timing diagram of bit line signals BL2_1 and BL3_1 in accordance with the embodiment of FIG. 6. Both the BL2_1 and the BL3_1 signals include a bit line precharge start time at time t1. At time t2, the bit lines are left floating and the word lines are selected. At time t3, the bit line voltage levels are read out by the data caches as described previously with reference to FIG. 3. Each data cache can adjust its bit line voltage sense level in response to which segment is selected. The further a selected bit line is from its associated data cache, the greater the bit line voltage for proper bit line sensing.

The B2_1 signal shows three possible outcomes 701-703 for bit line B2_1 at time t2. The top signal 701 shows that 0.6V is maintained if the neighbor bit lines are unchanged. The middle signal 702 shows that the original 0.6V is reduced to 0.3V if the neighboring bit lines drop to 0V. The lower signal 703 shows that the original 0.6V is reduced to 0V at time t3 if a cell's read current flows indicating an erased memory cell. Thus, a voltage greater than 0.3V is identified as a logical high for BL2 during a read operation.

The B3_1 signals also shows three possible outcomes 710-712 for bit line B3_1 at time t2. The top signal 710 shows that the original 0.6V is maintained if neighboring bit lines are unchanged. The middle signal 711 is reduced to 0.4V if the neighboring bit lines drop to 0V. This voltage is higher than the B2_1 example due to the different lengths of bit line coupled to the data cache. Referring again to the example of FIG. 6, it can be seen that the selected bit line BL2_1 is connected to the even data cache 2 602 and the selected bit line BL3_1 is connected to the odd data cache 3 606. BL3_1 thus traverses an extra segment than that of BL2_1, thus requiring a greater voltage on BL3_1 as set by the data cache 3 606. The lower signal 712 shows that the original 0.6V is reduced to 0V at time t3 if a cell's read current flows indicating an erased memory cell. Thus, a voltage greater than 0.4V is identified as a logical high for BL3 during a read operation.

Figure 8:
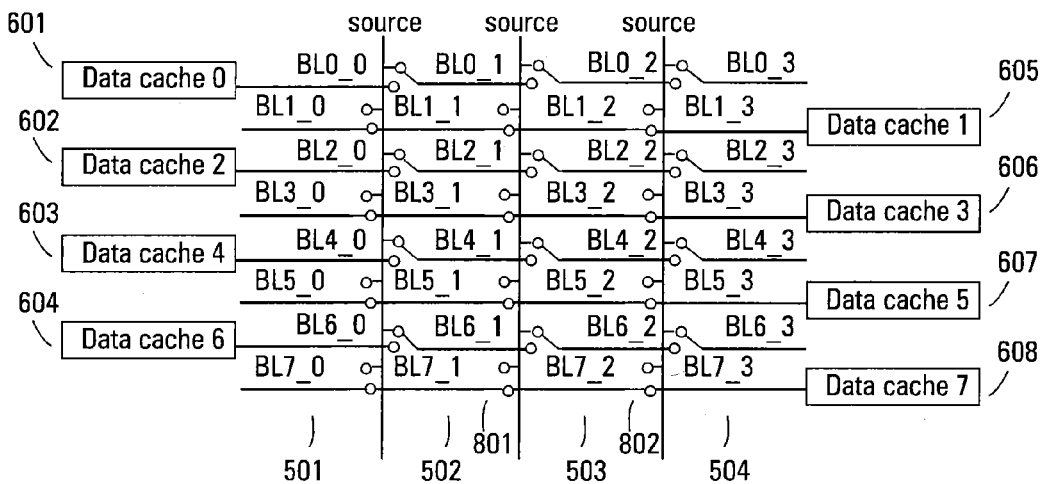
FIG. 8 shows an alternate embodiment of the operation of the connecting circuitry in accordance with the embodiment of FIG. 5.

FIG. 8 illustrates one example of an access to the memory cells of the bit lines in segment 0. The even bit line BL0_0 is connected to an associated data cache 601. In the same way, BL2_0, BL4_0 and BL6_0 are each connected to respective even data caches 602-604. The odd bit lines of BL1_0-BL1_3 are connected to an associated data cache 605 through the first, second and third sets of switches 501-503. In the same way, BL3_0-BL3_3, BL5_0-BL5_3, and BL7_0-BL7_3 are each connected to respective odd data caches 606-608. The remaining bit lines are all connected to a source line through respective switches.

Figure 9:
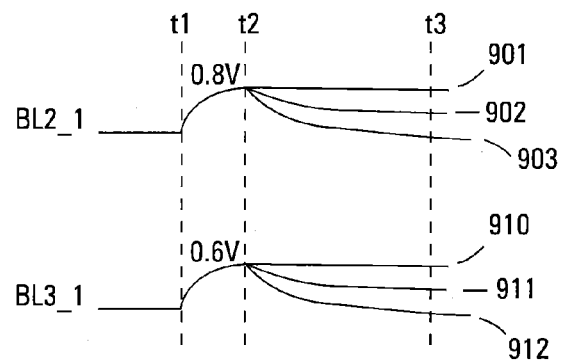
FIG. 9 shows a timing diagram of bit line signals in accordance with the embodiment of FIG. 8.

FIG. 9 shows a timing diagram of bit line signals BL2_0 and BL3_0 in accordance with the embodiment of FIG. 8. Both the BL2_0 and the BL3_0 signals include a bit line precharge start time at time t1. At time t2, the bit lines are left floating and the word lines are selected. At time t3, the bit line voltage levels are read out by the data caches as described previously with reference to FIG. 3. Each data cache can change its bit line voltage sense level as necessary in response to which segment is selected. Each data cache can also change its bit line precharge level as necessary in response to which segment is selected.

The B2_0 signal shows three possible outcomes 901-903 for bit line B2_0 at time t2. The top signal 901 shows that the original 0.8V is maintained if the neighbor bit lines are unchanged. The middle signal 902 shows that the original 0.8V is reduced to 0.2V if the neighboring bit lines drop to 0V. The lower signal 903 shows that the original 0.8V is reduced to 0V at time t3 if a cell's read current flows indicating an erased memory cell. Thus, a voltage greater than 0.2V is identified as a logical high for BL2 during a read operation.

The B3_0 signals also shows three possible outcomes 910-912 for bit line B3_0 at time t2. The top signal 910 shows that the original 0.6V is maintained if neighboring bit lines are unchanged. The middle signal 911 is reduced to 0.4V if the neighboring bit lines drop to 0V. This voltage is higher than the B2_0 example due to the different lengths of bit line coupled to the data cache. Referring again to the example of FIG. 8, it can be seen that the selected bit line BL2_0 is connected to the even data cache 2 602 and the selected bit line BL3_0 is connected to the odd data cache 3 606. BL3_0 thus traverses an extra three segments than BL2_0, thus requiring a greater voltage on BL3_0 as set by the data cache 3 606. The lower signal 912 shows that the original 0.6V is reduced to 0V at time t3 if a cell's read current flows indicating an erased memory cell. Thus, a voltage greater than 0.4V is identified as a logical high for BL3 during a read operation.

Figure 10:
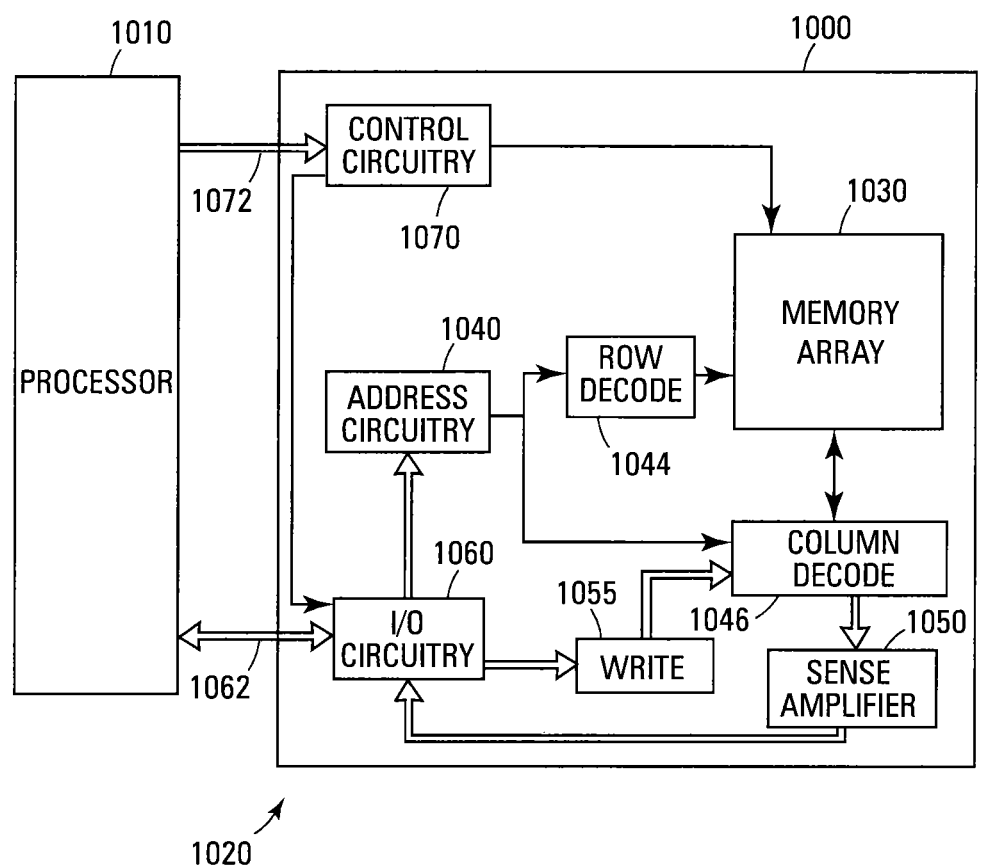
FIG. 10 shows a simplified block diagram of one embodiment of a memory system of the present invention.

FIG. 10 illustrates a functional block diagram of a memory system 1020 that includes a memory device 1000. The memory device 1000 is coupled to a system controller 1010. The controller 1010 may be a microprocessor or some other type of controller.

The memory device 1000 includes an array 1030 of non-volatile memory cells such as the array illustrated in FIG. 1 and discussed previously. The memory array 1030 is arranged in banks of word line rows and bit line columns. In one embodiment, the columns of the memory array 1030 are comprised of series strings of memory cells such as those illustrated in FIG. 2. As is well known in the art, the connections of the cells to the bit lines determines whether the array is a NAND architecture, an AND architecture, or a NOR architecture.

Address buffer circuitry 1040 is provided to latch address signals provided through the I/O circuitry 1060. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense amplifier circuitry 1050. The sense amplifier circuitry 1050, in one embodiment, is coupled to read and latch a row of data from the memory array 1030. I/O circuitry 1060 is included for bidirectional data communication as well as address communication over a plurality of data connections 1062 with the controller 1010. Write circuitry 1055 is provided to program data to the memory array 1030.

Memory control circuitry 1070 decodes signals provided on control connections 1072 from the controller 1010. These signals are used to control the operations on the memory array 1030, including data read, data write (program), and erase operations. The memory control circuitry 1070 may be a state machine, a sequencer, or some other type of control circuitry to generate the memory control signals. In one embodiment, the memory control circuitry 1070 is configured to transfer data to the memory array 1030 for execution of the programming embodiments discussed previously. The memory control circuitry 1070 is further configured to read data from the memory array 1030.

The memory device illustrated in FIG. 10 has been simplified to facilitate a basic understanding of the features of the memory. A more detailed understanding of internal circuitry and functions of flash memories are known to those skilled in the art.

CONCLUSION

In summary, one or more embodiments of the present invention provide a complimentary shielded bit line architecture that can be used during read operations in a memory device. The selected bit lines can be shielded by unselected bit lines during the read operation while the selected bit lines are read at substantially the same time. Switching circuitry switch data lines of a selected segment of a memory array to their associated data caches. The data caches can adjust the bit line voltage that is appropriate for the length of the coupled bit lines.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
a memory array comprising a plurality of non-volatile memory cells organized as a plurality of memory segments;
a plurality of data caches, coupled to the memory array; and
control circuitry coupled to the memory array and configured to control an access to the memory array, the control circuitry configured to control coupling of the plurality of data caches to a selected one of the plurality of memory segments wherein the control circuitry is further configured to switch each of the data lines of the selected memory segment to a respective one of the data caches;
wherein a data cache of the plurality of data caches is configured to adjust a bias voltage applied to a data line, of the selected memory segment and switched to that data cache of the plurality of data caches, responsive to a distance of that data cache of the plurality of data caches from the selected memory segment.

2. The memory device of claim 1 wherein the memory array comprises a NAND architecture of flash memory cells.

3. The memory device of claim 1 wherein the plurality of data caches are coupled to the memory array through switching circuitry that is controlled by the control circuitry.

4. A memory system comprising:
a controller configured to control operation of the memory system; and
a non-volatile memory device, coupled to the controller, that operates in response to the controller, the non-volatile memory device comprising:
a memory array comprising a plurality of memory segments wherein each memory segment is comprised of a plurality of data lines;
a plurality of data caches for storing data from the controller to be stored in the memory array and for storing data from the memory array to be transferred to the controller;
a plurality of switches coupling the plurality of data caches to the memory array; and
control circuitry coupled to the memory array and configured to control accessing the memory array wherein the control circuitry is configured to control the switches wherein a selected memory segment is coupled to the plurality of data caches such that all the data lines of the selected memory segment are accessed substantially simultaneously and at least one data line of an unselected memory segment is switched to a source line.

5. The memory system of claim 4 wherein each data cache is configured to adjust bias voltages for a respective one of the data lines responsive to a distance of the data cache from its selected memory segment.

6. The memory system of claim 4 wherein the control circuitry is further configured to control reading of the data lines of the selected memory segment substantially simultaneously.

7. A memory device comprising:
a plurality of memory cells;
a data line connected to the memory cells; and
a read control circuit for reading out data stored in a selected memory cell of the memory cells through the data line by biasing the data line with a biasing voltage and by sensing the data line that has the stored data,
wherein the read control circuit changes the biasing voltage based on a distance from the read control circuit to a location where the selected memory cell has been added.

8. The memory device of claim 7 wherein the read control circuit changes a sensing condition depending on the location where the selected memory cell has been added.

9. A memory device comprising:
a plurality of memory cells;
a data line connected to the memory cells, the data line being divided into plurality of segments;
a read circuit coupled with the data line for reading out data stored in a selected memory cell of the memory cells through the data line by biasing the data line with a biasing voltage and by sensing the data line that reflects the stored data; and
a read control circuit for reconfiguring the data line by isolating one or more segments of the plurality of segments from the read circuit, the isolated one or more segments not contributing to transfer of data from the selected memory cell to the read circuit and remaining segments of the plurality of segments coupling the read circuit to the selected memory cell, and for changing the biasing voltage based on a collective length of the remaining segments.

10. A memory device comprising:
a memory cell array comprising:
a first group of memory cells;
a first data line connected to the first group, the first data line being divided into plural segments;
a second group of memory cells;
a second data line connected to the second group, the second data line being divided into plural segments; and a plurality of word lines each connected to a pair of memory cells, one from the first group and another from the second group;

a first read circuit, connected to the first data line and located at one side of the array, for biasing the first data line with a first biasing voltage and for sensing the first data line;

a second read circuit, connected to the second data line and located at an opposite side of the array, for biasing the second data line with a second biasing voltage and for sensing the second data line; and a read control circuit for selecting a pair of memory cells by selecting a word line, for reconfiguring the first and second data lines by isolating parts of segments from respective read circuits, the parts not contributing to transfer of data from the selected pair of memory cells to respective read circuits, for changing the first biasing voltage based on a distance from the first group of memory cells to the first read circuit and changing the second biasing voltage based on a distance from the second group of memory cells to the second read circuit.

11. A memory device comprising:

a memory cell array comprising:
  a first group of memory cells;
  a first data line connected to the first group, the first data line being divided into plural segments;
  a second group of memory cells;
  a second data line connected to the second group, the second data line being divided into plural segments;
  a plurality of word lines each connected to a pair of memory cells, one from the first group and another from the second group; and
  a source line coupled with the first and second groups of the memory cells;

a first data cache, connected to the first data line and located at one side of the array, for biasing the first data line and for sensing the first data line;

a second data cache, connected to the second data line and located at an opposite side of the array, for biasing the second data line and for sensing the second data line; and a read control circuit for selecting a pair of memory cells by selecting a word line, for reconfiguring the first and second data lines by isolating parts of segments from respective read circuits, the parts not contributing to transfer of data from the selected pair of memory cells to respective read circuits, for changing at least one of the bias condition and the sensing condition of the first read circuit depending on a location where the selected memory cells have been put in, for changing at least one of the bias condition or the sensing condition of the second read circuit depending on a location where the selected memory cells have been added, and for connecting the parts of segments to the source line.

12. The memory device of claim 11 wherein each data cache comprises a bit line voltage control circuit and a data latch circuit.

13. The memory device of claim 12 wherein the data latch circuit is configured to input and output data on an I/O path coupled to the data cache.

14. The memory device of claim 13 wherein the I/O path comprises a serial I/O bus.

15. The memory device of claim 13 wherein the data latch circuit is coupled to the I/O path through enabling transistors.

16. The memory device of claim 12 wherein the bit line voltage control circuit comprises a precharge transistor coupled to a bit line voltage clamp transistor.

17. The memory device of claim 16 wherein the bit line voltage clamp transistor is a first bit line voltage clamp transistor that is coupled in series with a second bit line voltage clamp transistor wherein the first and second bit line voltage clamp transistors are configured to transfer data stored in the data latch circuit to a respective bit line.

18. The memory device of claim 16 wherein the bit line voltage control circuit is configured to control bit line precharge voltage levels and bit line sense levels during a read operation.

19. The memory device of claim 16 wherein the bit line voltage clamp transistor, in response to a bit line clamp voltage applied to the bit line voltage clamp transistor, is configured to generate various bit line precharge levels.

20. The memory device of claim 12 wherein the data latch circuit comprises a pair of inverters configured to sense a potential level of a respective bit line.

* * * * *